(12) United States Patent
Jarrige et al.

(10) Patent No.: US 8,476,917 B2
(45) Date of Patent: Jul. 2, 2013

(54) QUIESCENT CURRENT (IDDQ) INDICATION AND TESTING APPARATUS AND METHODS

(75) Inventors: Nicolas A. Jarrige, Mesa, AZ (US); Ibrahim Shihadeh Kandah, Canton, MI (US)

(73) Assignee: Freescale Semiconductor, Inc., Austin, TX (US)

( * ) Notice: Subject to any disclaimer, the term of this patent is extended or adjusted under 35 U.S.C. 154(b) by 602 days.

(21) Appl. No.: 12/696,257

(22) Filed: Jan. 29, 2010

(65) Prior Publication Data
US 2011/0187396 A1 Aug. 4, 2011

(51) Int. Cl.
*G01R 31/10* (2006.01)
(52) U.S. Cl.
USPC ............. 324/750.3; 324/762.02; 324/762.09; 324/537
(58) Field of Classification Search
USPC ............ 324/750.3, 126, 537, 762.01–762.02, 324/762.09
See application file for complete search history.

(56) References Cited

U.S. PATENT DOCUMENTS

| | | | |
|---|---|---|---|
| 5,773,990 A | 6/1998 | Wilstrup et al. | |
| 5,850,404 A | 12/1998 | Sanada | |
| 5,889,789 A | 3/1999 | Sanada | |
| 6,118,293 A * | 9/2000 | Manhaeve et al. | 324/750.3 |
| 6,127,838 A | 10/2000 | Sachdev | |
| 6,313,657 B1 * | 11/2001 | Hashimoto | 324/762.02 |
| 6,496,028 B1 * | 12/2002 | Manhaeve et al. | 324/762.01 |
| 6,686,756 B2 | 2/2004 | Thibeault | |
| 7,148,717 B2 | 12/2006 | Binkley et al. | |
| 7,274,203 B2 * | 9/2007 | Tumin et al. | 324/762.02 |
| 7,282,905 B2 | 10/2007 | Chen et al. | |
| 7,362,104 B2 | 4/2008 | Hashimoto | |
| 7,576,555 B2 | 8/2009 | Hashimoto | |
| 2003/0057987 A1 * | 3/2003 | Ohlhoff et al. | 324/763 |
| 2003/0062916 A1 | 4/2003 | Manhaeve et al. | |
| 2005/0024075 A1 | 2/2005 | Srivastava | |
| 2005/0270054 A1 | 12/2005 | Van Hees | |
| 2009/0309621 A1 * | 12/2009 | Hammerschmidt | 324/763 |
| 2009/0322367 A1 | 12/2009 | Priel et al. | |
| 2010/0320997 A1 * | 12/2010 | McQuirk et al. | 324/76.11 |
| 2011/0050250 A1 * | 3/2011 | Ivanov et al. | 324/654 |

OTHER PUBLICATIONS

PCT/US2011/021711 International Search Report and Written Opinion mailed Sep. 15, 2011.

* cited by examiner

*Primary Examiner* — Arleen M Vazquez
(74) *Attorney, Agent, or Firm* — Sherry W. Schumm

(57) ABSTRACT

An embodiment of an electronic device includes a logic circuit, a switching element, and a quiescent current (IDDQ) evaluation circuit. The logic circuit is coupled to a first ground node. The switching element is coupled between the first ground node and a second ground node. The switching element is configurable in an electrically non-conductive state when the electronic device is in an IDDQ evaluation state, and in an electrically conductive state when the electronic device is not in the IDDQ evaluation state. When the electronic device is in the IDDQ evaluation state, the IDDQ evaluation circuit is configured to provide a first output signal when an IDDQ indicating voltage across the first and second ground nodes exceeds a reference voltage. Other embodiments include methods for producing an indication of IDDQ in an electronic device and methods for fabricating an electronic device with the capability of producing an IDDQ indication.

17 Claims, 4 Drawing Sheets

QUIESCENT CURRENT (IDDQ) INDICATION AND TESTING APPARATUS AND METHODS

TECHNICAL FIELD

Embodiments relate to apparatus and methods for indicating and testing quiescent current (IDDQ) produced by an electronic device.

BACKGROUND

Measurements of leakage current produced during quiescence of an electronic device (i.e., "quiescent current" or "IDDQ") may indicate a failure of one or more transistors of the device's logic circuitry. More particularly, when an IDDQ measurement falls outside of a range of normal operational values, it may be assumed that one or more transistors within the logic circuitry have failed. Accordingly, IDDQ measurements are often employed in manufacturing processes in order to identify and reject faulty devices prior to customer shipment.

A conventional method for measuring a device's IDDQ includes installing the device in a device carrier that is electrically interconnected with automated test equipment (ATE), and initiating an ATE IDDQ measurement test. In accordance with one IDDQ measurement method, a particular pin of the device is designated for the purpose of pinning out the internal voltage supply to the logic circuitry. With the internal voltage supply pinned out, an IDDQ measurement may be made by disabling the internal voltage supply and providing the supply voltage externally via the ATE. Using this method, IDDQ may be measured on the supply side of the logic circuitry. In accordance with another IDDQ measurement method, a particular pin of the device is designated for the purpose of pinning out the ground line to the logic circuitry. During testing, this pin is shorted to the main device ground externally, and IDDQ may thus be measured on the ground side of the logic circuitry.

Although such IDDQ measurement methods may be sufficient for testing some devices, they may be inadequate for testing others. For example, in die size limited and/or pin limited devices, it may be impractical to designate one or more pins for the specific purpose of performing IDDQ measurements. In addition or alternatively, some devices may include relatively small logic circuitry (e.g., logic circuitry with relatively few transistors), and an extremely small IDDQ (e.g., an IDDQ in a micro- or nano-amp range) may indicate a transistor failure. Conventional ATE used for IDDQ testing may not be capable of accurately measuring such small IDDQs. Inaccurate measurements may lead to faulty devices being released to customers.

DETAILED DESCRIPTION

Embodiments include apparatus and methods for indicating and testing quiescent current (IDDQ) produced by an electronic device. According to an embodiment, an electronic device includes an IDDQ evaluation circuit on a ground side of a logic circuit. When the device is in an IDDQ evaluation state, the IDDQ evaluation circuit may produce an indication, via a pin of the device, of whether or not IDDQ from the logic circuit exceeds an acceptance value, according to an embodiment. For example, the IDDQ indication may be a binary indication, where a first logic level indicates that the IDDQ exceeds the acceptance value, and a second logic level indicates that the IDDQ does not exceed the acceptance value. Such an indication may be used as a basis for rejecting the device, rather than relying on an external measurement of the actual IDDQ as is performed using conventional methods. Accordingly, embodiments may allow an accurate IDDQ indication to be provided even in devices that include relatively small logic circuitry. According to another embodiment, the pin designated for producing the IDDQ indication may be used for other purposes when the device is in a normal operational state (rather than the IDDQ evaluation state). Accordingly, embodiments may enable an IDDQ indication to be produced without having to disconnect the voltage supply or to designate one or more pins specifically for the purpose of IDDQ testing.

Figure 1:
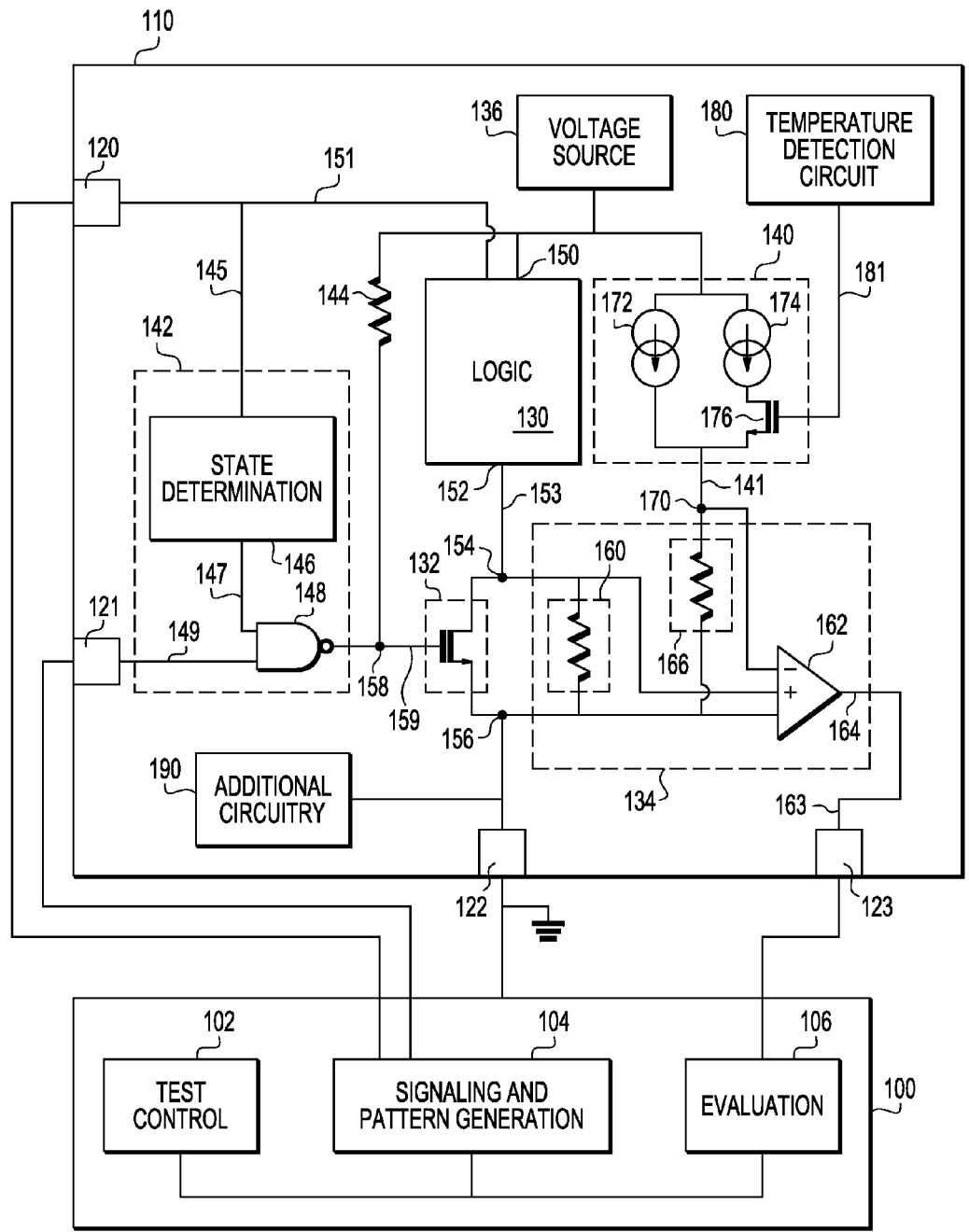
FIG. 1 illustrates a simplified schematic block diagram of an IDDQ test setup and a portion of an electronic device that includes apparatus for indicating IDDQ, according to an example embodiment.

FIG. 1 illustrates a simplified schematic block diagram of IDDQ test equipment 100 and a portion of an electronic device 110 that includes apparatus for indicating IDDQ, according to an example embodiment. According to an embodiment, IDDQ test equipment 100 is electrically interconnectable with external pins (e.g., pins 120, 121, 122, 123) of electronic device 110 through a test bed (not illustrated) within which electronic device 110 is installed. Prior to IDDQ testing, electronic device 110 may be packaged within any of a number of different types of packages (e.g., in-line, flat pack, ball grid array, pin grid array, and leadless packages, to name a few), according to various embodiments. Alternatively, electronic device 110 may be tested at the wafer or singulated device (i.e., unpackaged) stages, according to other embodiments.

IDDQ test equipment 100 may include, for example, a test control section 102, a signaling and pattern generation section 104, and an evaluation section 106, according to an embodiment. IDDQ test equipment 100 may automatically perform an IDDQ test under the control of test control section 102 (i.e., IDDQ test equipment 100 may be an automated test equipment (ATE) setup), or IDDQ test equipment 100 may be configured to enable an operator manually to perform an IDDQ test of electronic device 110, according to various embodiments. In an ATE embodiment, test control section 102 is configured to execute algorithms that control the sequence and timing of operations performed by signaling and pattern generation section 104 and evaluation section 106 in conjunction with performing an IDDQ evaluation of electronic device 110. The operations performed by signaling and pattern generation section 104 and evaluation section 106 will be explained in more detail below, in conjunction with an explanation of the functionality of electronic device 110 in the context of IDDQ testing.

Electronic device 110 includes a plurality of pins 120-123 that enable electrical signals to be exchanged between the circuitry of electronic device 110 and external systems (e.g., IDDQ test equipment 100 and/or electronic devices of a system within which electronic device 110 ultimately is integrated). For example, an internal ground structure of electronic device 110 may be electrically coupled to one or more pins (e.g., pin 122), which in turn may be electrically coupled with IDDQ test equipment 100 and/or a ground plane of a system within which electronic device 110 ultimately is integrated. In an embodiment, any or all of pins 120-123 may be used for multiple purposes. More particularly, input and output signals present on pins 120-123 may be provided or evaluated in a first manner when electronic device 110 is in a normal operational state, and input and output signals present on pins 120-123 may be provided or evaluated in a second and different manner when electronic device 110 is in an IDDQ evaluation state. Accordingly, the capability of performing an IDDQ evaluation may be implemented in electronic device 110 without the necessity for additional pins designated for this purpose, in an embodiment. Although the term "pins" is used throughout this description, it is to be understood that the term "pins" is intended to include a variety of different types of contacts (e.g., pins, pads, bumps, solder balls, wafer contact points, and so on) that enable signals to be exchanged between the circuitry of a device and external devices. Although only four pins 120-123 are illustrated, it is to be understood that electronic device 110 may (and is likely to) include additional pins as well. However, for purposes of simplicity, only pins 120-123 are illustrated, as pins 120-123 are relevant to the descriptions, herein, of various embodiments.

According to an embodiment, electronic device 110 also includes at least one logic circuit 130, a switching element 132, an IDDQ evaluation circuit 134, and a voltage source 136. Logic circuit 130, current source 140, and pull-up resistor 144 receive power from voltage source 136, in an embodiment. In other embodiments, these elements may receive power from distinct voltage sources of electronic device 110, or one or more of these elements may receive power from an external voltage source. Although only one each of logic circuit 130, switching element 132, IDDQ evaluation circuit 134, and voltage source 136 are illustrated in FIG. 1, it is to be understood that multiple instantiations of any one or more of these device elements may be included in an electronic device. For example, an instantiation of one or more of these elements may be associated with each of a plurality of different functional blocks and/or power sub-domains of an electronic device. For purposes of conciseness, only single instantiations of logic circuit 130, switching element 132, IDDQ evaluation circuit 134, and voltage source 136 are discussed herein. Electronic device 110 may include additional circuitry 190, as well, which may perform various functions that are not necessarily related to the functionality discussed herein.

Logic circuit 130 receives power from voltage source 136 at a supply input 150 (i.e., an input on the "supply-side" of logic circuit 130), according to an embodiment. Logic circuit 130 includes one or more transistors, which may be configured to perform any of a number of different functions. According to an embodiment, during an IDDQ test procedure, the various transistors of logic circuit 130 may be set to particular states by "scanning" a signal (e.g., a test pattern 151) into electronic device 110. For example, signal and pattern generation section 104 of test equipment 100 may provide a test pattern 151 to logic circuit 130 through a device pin (e.g., pin 120). Once the transistors of logic circuit 130 are in a steady state (i.e., they are not being actively switched and logic circuit 130 is "quiescent"), a cumulative quiescent leakage current through the transistors (or IDDQ 153) may be present at a logic ground output 152 (i.e., an output on the "ground-side" of logic circuit 130). According to an embodiment, the logic ground output 152 is electrically coupled with a first ground node 154, and accordingly the IDDQ 153 produced by logic circuit 130 may be presented at first ground node 154.

Switching element 132 and IDDQ evaluation circuit 134 are electrically coupled in parallel across first ground node 154 and a second ground node 156, according to an embodiment. Switching element 132 is configurable in an electrically conductive state and an electrically non-conductive state. While in the electrically conductive state, current may readily flow through switching element 132 from the first ground node 154 to the second ground node 156. Conversely, while in the electrically non-conductive state, current flow through switching element 132 between the first and second ground nodes 154, 156 is restricted (i.e., essentially to zero or a negligible amount). According to an embodiment, switching element 132 includes a metal oxide semiconductor field effect transistor (MOSFET), which includes a source coupled to the first ground node 154, a drain coupled to the second ground node 156, and a gate that is coupled to a control node 158. In a more particular embodiment, switching element 132 includes an NMOSFET, although it is to be understood that switching element 132 may include a different type of transistor and/or switching element 132 may include multiple transistors and additional circuitry, in other embodiments.

A control signal 159 may be provided to switching element 132 (e.g., to the gate of the MOSFET) via the control node 158, and switching element 132 is responsive to the control signal 159 to place switching element 132 in the electrically conductive state or in the electrically non-conductive state. According to an embodiment, a control signal 159 having a relatively high voltage value causes switching element 132 to transition into or remain in the electrically conductive state, and a control signal 159 having a relatively low voltage value causes switching element 132 to transition into or remain in the electrically non-conductive state. When electronic device 110 is to be transitioned into or retained in an IDDQ evaluation state, the control signal 159 is provided to place switching element 132 in the non-electrically conductive state, according to an embodiment. Conversely, when electronic device 110 is to be transitioned into or retained in a normal operational state, the control signal 159 is provided to place switching element 132 in the electrically conductive state. To ensure that the control node 158 is in an unambiguous state (i.e., that the conduction mode of switching element 132 always is in an intended state), electronic device 110 may include a pull-up resistor 144 electrically coupled between voltage source 136 and control node 158, which may establish the control signal 159 at a relatively high level in the absence of a signal to the contrary.

In an embodiment, the control signal 159 provided to switching element 132 is produced by IDDQ test enable circuit 142. IDDQ test enable circuit 142 is electrically coupled to switching element 132, and is configured to make a determination of whether or not the electronic device 110 should enter the IDDQ evaluation state. When IDDQ test enable circuit 142 determines that electronic device 110 should enter the IDDQ evaluation state, IDDQ test enable circuit 142 produces the control signal 159 at a level that causes switching element 132 to be placed in the electrically non-conductive state.

IDDQ test enable circuit 142 includes a state determination circuit 146 and a state confirmation element 148, in an embodiment. State determination circuit 146 is configured to receive an external signal 145 through an external contact (e.g., pin 120), and to evaluate the external signal 145 in order to determine whether the electronic device 110 should transition to the IDDQ evaluation state, according to an embodiment. Pin 120, to which state determination circuit 146 is electrically coupled, also may be electrically coupled to test equipment 100 (e.g., to signaling and pattern generation section 104 of test equipment 100). In an embodiment, signaling and pattern generation section 104 may produce a particular signaling pattern (e.g., external signal 145) that corresponds to a request for electronic device 110 to enter the IDDQ evaluation state, and this pattern is provided via pin 120. When state determination circuit 148 detects the particular signaling pattern, state determination circuit 148 may provide an IDDQ evaluation state enable signal 147 (referred to simply as "enable signal" below).

In an embodiment, the enable signal 147 is provided to state confirmation element 148, along with an external confirmation signal 149 provided at another external contact (e.g., pin 121). The external confirmation signal 149 may be implemented to ensure that switching element 132 is not inadvertently switched to a non-conductive state by state determination circuit 146 (e.g., while electronic device 110 is intended to be in a normal operational state). According to an embodiment, pin 121 also may be electrically coupled to test equipment 100 (e.g., to signaling and pattern generation section 104 of test equipment 100), and signaling and pattern generation section 104 may provide the external confirmation signal 149. State confirmation element 148 may include, for example, a logical element having a first input electrically coupled with the state determination circuit 146, a second input electrically coupled with external pin 121, and an output configured to provide the control signal 159 to switching element 132. In a more particular embodiment, state confirmation element 148 includes a gate that implements a logical NAND operation (e.g., a NAND gate), and state determination circuit 146 provides the enable signal 147 at a relatively high level when a determination is made to transition the electronic device 110 into the IDDQ evaluation state. When the external confirmation signal 149 also is provided at a relatively high level, state confirmation element 148 produces the control signal 159 at a relatively low level, which causes switching element 132 to enter the non-conductive state (e.g., thus causing electronic device 110 to enter the IDDQ evaluation state).

In alternate embodiments, state determination circuit 146 may provide enable signal 147 at a relatively low level to indicate that the electronic device 110 should enter the IDDQ evaluation state, and/or test equipment 100 may provide the external confirmation signal 149 at a relatively low level to confirm that the electronic device 110 should enter the IDDQ evaluation state, and/or state confirmation element 148 may implement a different type of logic to produce the control signal 159 at a relatively low level when a determination is made and confirmed that the electronic device 110 should enter the IDDQ evaluation state. In still another alternate embodiment, state determination circuit 146 may provide the enable signal 147 directly to switching element 132 (e.g., state determination circuit 146 may provide enable signal 147 at a relatively low level to indicate that the electronic device 110 should enter the IDDQ evaluation state), and state confirmation element 148 may be excluded altogether. In still another alternate embodiment, both state determination circuit 146 and state confirmation element 148 may be excluded from electronic device 110, and test equipment 100 may provide the external confirmation signal 149 as the control signal 159 (e.g., test equipment 100 may provide the external confirmation signal 149 (or control signal 159) at a relatively low level to indicate that the electronic device 110 should enter the IDDQ evaluation state).

When switching element 132 is in the electrically non-conductive state (e.g., when electronic device 110 is in the IDDQ evaluation state), IDDQ 153 produced by logic circuit 130 is received and evaluated by IDDQ evaluation circuit 134. IDDQ evaluation circuit 134 includes a first resistive element 160, a comparison circuit 162, and a second resistive element 166, in an embodiment. First resistive element 160 is electrically coupled between the first and second ground nodes 154, 156 and in parallel with switching element 132, according to an embodiment. Resistive element 160 may include one or more resistors, which are coupled together in a configuration that results in a relatively high resistance between the first and second ground nodes 154, 156. According to an embodiment, resistive element 160 has a total resistance greater than about 20 kilo Ohms (kOhms), although resistive element 160 may have a lower total resistance, in an alternate embodiment.

Substantially all IDDQ 153 produced by logic circuit 130 flows through resistive element 160 when electronic device 110 is in the IDDQ evaluation state (e.g., when switching element 132 is in the electrically non-conductive state). According to an embodiment, a measurable voltage is produced across resistive element 160 when the IDDQ is non-negligible, where the voltage is approximately equal to the IDDQ current value multiplied by the total resistance of resistive element 160. As used herein, a voltage presenting itself across resistive element 160 as a result of IDDQ 153 produced by logic circuit 130 is referred to as an "IDDQ indicating voltage."

Second resistive element 166 is electrically coupled between a reference node 170 and second ground node 156, according to an embodiment. Second resistive element 166 may include one or more resistors, which are coupled together in a configuration that results in a relatively high resistance between the reference and second ground nodes 170, 156. According to an embodiment, resistive element 166 has a total resistance greater than about 30 kOhms, although resistive element 166 may have a lower total resistance, in an alternate embodiment. According to an embodiment, first and second resistive elements 160, 166 may have substantially equal resistances. According to another embodiment, first and second resistive elements 160, 166 may have substantially identical configurations and may be fabricated during the same processing steps, so that first and second resistive elements 160, 166 have substantially equal resistances even in the face of variations in process, voltage, and temperature (PVT).

Electronic device 110 also includes a current source 140, in an embodiment, which is electrically coupled between voltage source 136 and reference node 170. Current source 140 produces a current 141 at a first level at reference node 170, and the current 141 flows through second resistive element 166. Accordingly, the current 141 causes a reference voltage to present itself across second resistive element 166 (i.e., across reference and second ground nodes 170, 156). In an embodiment, the reference voltage is used to determine whether IDDQ produced by logic circuit 130 is unacceptably high (e.g., indicating that one or more transistors within logic circuit 130 may be faulty, and thus that electronic device 110 should be rejected). As will be described in more detail below, the reference voltage across second resistive element 166 is compared (e.g., by comparison circuit 162) with the IDDQ indicating voltage across first resistive element 160 to determine whether the IDDQ 153 produced by logic circuit 130 is greater or less than the reference voltage.

IDDQ 153 may be affected by device temperature. More particularly, when electronic device 110 has a relatively high temperature, IDDQ 153 may be higher than when electronic device 110 has a relatively low temperature, despite whether or not any transistor within logic circuit 130 is faulty. In an embodiment, electronic device 110 is configured to change the reference voltage based on temperature, and thus to alter the comparison of the IDDQ indicating voltage and the reference voltage based on device temperature. More particularly, when the temperature of electronic device 110 is considered to be "cold" or at "room temperature", the reference voltage may be established at a first, relatively low level, and when the temperature of electronic device 110 is considered to be "hot", the reference voltage may be established at a second, relatively high level.

According to an embodiment, implementation of a variable reference voltage is achieved using a temperature detection circuit 180 and an embodiment of current source 140 that is variable or switchable. More particularly, in an embodiment, current source 140 is configured to produce current 141 at both the first level, as discussed previously, and at a second, relatively higher level. In such an embodiment, current source 140 may include a first current leg 172 and a second current leg 174, where current 141 produced by the first and second current legs 172, 174 is cumulative at reference node 170, and current conduction from second current leg 174 to the reference node 170 may be permitted or restricted via a transistor 176 or other switching element. According to a more particular embodiment, each current leg 172, 174 may include a current mirror circuit, which enables their respective currents to be produced with accuracy. The current 141 produced by current source 140 is in a range of about 0.5 micro amps (µA) to about 3 µA, in an embodiment, where each current leg 172, 174 may produce a current in a range of about 0.5 µA to about 1.5 µA. When the current 141 produced by current source 140 is at a relatively low level (e.g., only current leg 172 is coupled to reference node 170), a reference voltage having a relatively low value presents itself across second resistive element 166. Conversely, when the current 141 produced by current source 140 is at a relatively high level (e.g., both current legs 172, 174 are coupled to reference node 170), a reference voltage having a relatively high value presents itself across second resistive element 166.

As discussed above, electronic device 110 also may include a temperature detection circuit 180, according to an embodiment, which is electrically coupled to current source 140. Temperature detection circuit 180 produces an output signal 181, and current source 140 is responsive to the output signal 181 to produce current 141 at the relatively low or the relatively high level. More particularly, temperature detection circuit 180 is configured to sense a device temperature, and to determine whether the device temperature exceeds a temperature threshold. When the temperature detection circuit 180 determines that the device temperature does not exceed the threshold, temperature detection circuit 180 may produce the output signal 181 at a first level, and when the temperature detection circuit 180 determines that the device temperature does exceed the threshold, temperature detection circuit 180 may produce the output signal 181 at a second level, which is different from the first level. The level of the output signal 181 may control the level of current 141 produced by current source 140. In an embodiment, output signal 181 may determine whether current conduction through the second current leg 174 of current source 140 is permitted or restricted (e.g., the output signal may control whether transistor 176 allows current conduction from the second current leg 174 to the reference node 170). Accordingly, the level of the output signal 181 may determine whether the reference voltage presented across resistive element 166 is at a relatively high or a relatively low level.

The temperature threshold used by temperature detection circuit 180 may be a predetermined value, according to an embodiment. For example, the temperature threshold may have a value in a range of about 50 degrees Celsius to about 60 degrees Celsius, although the temperature threshold may have a lower or higher value, as well. According to an embodiment, the temperature threshold used when electronic device 110 is in the IDDQ evaluation state may be different from (e.g., lower than) an "over temp" temperature threshold used during a normal operational state (e.g., a temperature threshold used to determine whether electronic device 110 should temporarily be shut down to avert device damage due to high operating temperatures). Such an "over temp" temperature threshold may have a value greater than 100 degrees Celsius, for example.

In the embodiment discussed above, temperature detection circuit 180 is configured to indicate whether the device temperature is greater or less than a single temperature threshold in conjunction with the IDDQ evaluation state. In an alternate embodiment, temperature detection circuit 180 may be configured to compare the device temperature with multiple thresholds (e.g., two or more thresholds), and thus to indicate whether the device temperature is greater or less than any of multiple thresholds. In such an embodiment, current source 140 may be configured to produce current 141 at more than two levels (e.g., three or more levels), and thus, more than two reference voltages may be established across resistive element 166 (e.g., three or more reference voltages). In another alternate embodiment, temperature detection circuit 180 may indicate device temperature in an analog manner, and current source 140 may increase or decrease the current 141 that it produces as an analog function of the indicated temperature. Accordingly, the reference voltage may be varied in an analog manner, in an alternate embodiment.

As briefly discussed above, comparison circuit 162 is configured to compare the IDDQ indicating voltage (i.e., the voltage produced across resistive element 160 or first and second ground nodes 154, 156) with the reference voltage (i.e., a voltage produced across reference and second ground nodes 170, 156), and to provide an output signal 163 (also referred to herein as an "IDDQ threshold signal") at an output 164 of comparison circuit 162 when the IDDQ indicating voltage exceeds the reference voltage. For example, when the IDDQ indicating voltage exceeds the reference voltage, comparison circuit 162 may provide an output signal 163 at a relatively high level, and when the IDDQ indicating voltage does not exceed the reference voltage, comparison circuit 162 may provide an output signal 163 at a relatively low level, although the reverse may be implemented, in an alternate embodiment. Output 164 is electrically coupled with an external contact (e.g., pin 123) of electrical device 110. Accordingly, the output signal 163 produced by comparison circuit 162 may be detected by external equipment that is electrically connected with pin 123. As used herein, output signal 163 may be referred to as an "IDDQ indication."

According to an embodiment, test equipment 100 is electrically connected with pin 123, and evaluation section 106 of test equipment 100 is configured to detect the level of the output signal 163 produced by comparison circuit 162. When the output signal 163 has a value that indicates that the IDDQ indicating voltage exceeds the reference voltage, evaluation section 106 may cause test equipment 100 to produce a human or computer perceptible alert signal. When implemented in a manufacturing process, the perceptible alert signal may initiate rejection of electronic device 110 either by a human evaluator or a computer/mechanical device associated with the manufacturing line (e.g., the electronic device 110 may automatically be routed to a rejected part bin). In other words, when an IDDQ indication (e.g., output signal 163) indicates that the IDDQ 153 exceeds acceptable levels (e.g., the IDDQ indicating voltage exceeds the reference voltage), electronic device 110 may be rejected. Otherwise, electronic device 110 may be accepted.

Figure 2:
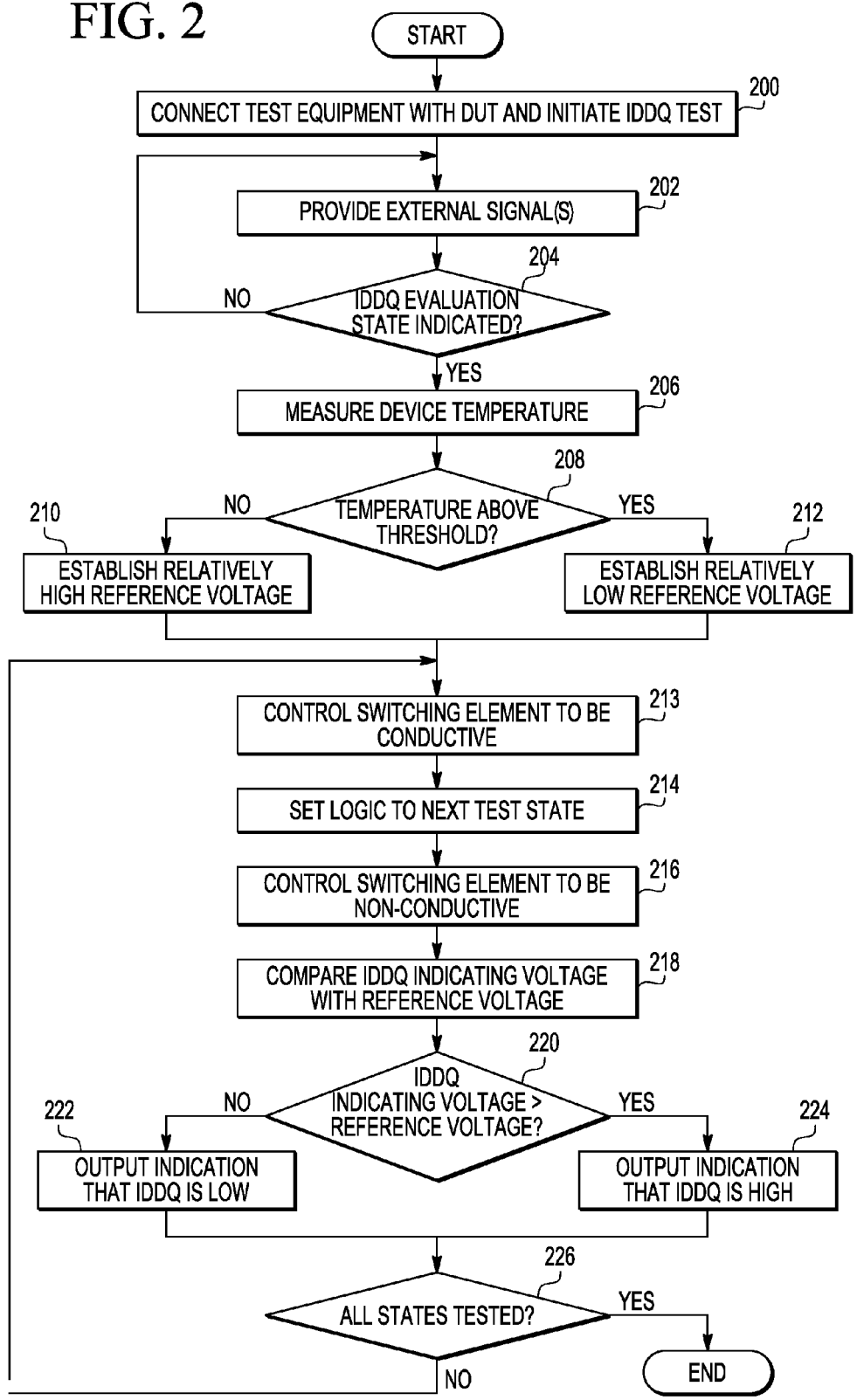
FIG. 2 is a flowchart of a method for producing an IDDQ indication for an electronic device, according to an example embodiment.

FIG. 2 is a flowchart of a method for producing an IDDQ indication for an electronic device, according to an example embodiment. The below description of FIG. 2 refers to an embodiment of FIG. 1, above, and therefore FIG. 2 should be viewed simultaneously with FIG. 1 for enhanced understanding. However, it is to be understood that embodiments of the method described in conjunction with FIG. 2 are not limited to the embodiment illustrated in FIG. 1.

The method for producing an IDDQ indication may begin, in block 200 by connecting test equipment (e.g., test equipment 100) with a device under test (DUT) (e.g., electronic device 110) that is configured to indicate IDDQ, as previously described. Connecting the test equipment may include installing the DUT in a device carrier that is coupled with the test equipment, where contacts of the device carrier associated with performing an IDDQ test are positioned in locations that correspond with pins of the DUT associated with performing the IDDQ test (e.g., pins 120-123, FIG. 1). The IDDQ test may then be initiated by the test equipment.

In block 202, the test equipment provides external signals to one or more pins of the DUT, where the signals are configured to cause the DUT to transition into an IDDQ evaluation state. For example, a signaling and pattern generation section (e.g., section 104) of the test equipment may provide a particular signaling pattern to a first pin (e.g., pin 120), and the signaling pattern may be received and evaluated within the DUT (e.g., by state determination circuit 146). In addition, the signaling and pattern generation section may provide an external confirmation signal (e.g., signal 149) to another DUT pin (e.g., pin 121), as described previously. In alternate embodiments, the test equipment may provide one or the other of a signaling pattern or an external confirmation signal, but not both.

In block 204, the DUT may make a determination of whether the external signals provided by the test equipment indicate that the DUT is to transition into the IDDQ evaluation state. This determination may be made, for example, by an IDDQ test enable circuit (e.g., circuit 142), according to various embodiments. When the external signals do not indicate that the DUT is to transition into the IDDQ evaluation state, the method may iterate as shown. When the external signals do indicate that the DUT is to transition into the IDDQ evaluation state, then such a transition may be initiated by the DUT. Blocks 206-216 include various processes associated with transitioning the DUT into the IDDQ evaluation state.

In an embodiment in which a reference voltage is established based on a temperature of the DUT, the device temperature may be measured (e.g., by temperature detection circuit 180), in block 206. A determination may then be made, in block 208, whether the device temperature exceeds a threshold. When the device temperature does exceed the threshold, then a relatively high reference voltage may be established, in block 210. According to an embodiment, establishment of the relatively high reference voltage may include the temperature detection circuit producing an output signal (e.g., signal 181) that causes a current source (e.g., current source 140) to produce a current (e.g., current 141) at a relatively high level. The relatively high current, when provided to a resistive element (e.g., resistive element 166) results in establishment of a relatively high reference voltage across the resistive element. When the device temperature does not exceed the threshold, then a relatively low reference voltage may be established, in block 212. According to an embodiment, establishment of the relatively low reference voltage may include the temperature detection circuit producing an output signal that causes the current source to produce a current at a relatively low level. The relatively low current provided to the resistive element results in establishment of a relatively low reference voltage across the resistive element.

In block 213, the switching element (e.g., switching element 132) on the ground side of the logic circuit is established in a conductive state, if it is not already in such a state. According to an embodiment, this includes providing a control signal (e.g., control signal 159) at a control node (e.g., control node 158) associated with the switching circuit, which causes the switching circuit to transition to or remain in the conductive state. Establishment of the switching element in the conductive state is performed in preparation for scanning a test pattern into the logic circuit of the DUT (e.g., logic circuit 150), according to an embodiment. In block 214, the logic circuit may be set to an initial (or next, for subsequent iterations) test state. According to an embodiment, this includes the signaling and pattern generation section 104 of the test equipment 100 scanning an initial (or next) test pattern into the logic circuit 150 via a DUT pin (e.g., pin 120). In block 216, the switching element (e.g., switching element 132) on the ground side of the logic circuit is established in a non-conductive state. According to an embodiment, this includes providing a control signal (e.g., control signal 159) at a control node (e.g., control node 158) associated with the switching circuit, which causes the switching circuit to transition to the non-conductive state. As discussed previously, the control signal may be generated in response to external signals provided by the test equipment through one or more pins (e.g., pins 120 and/or 121) of the electronic device. For example, a first external signal (e.g., signal 145 received through pin 120) may be evaluated (e.g., by state determination circuit 146) to produce an IDDQ enable signal (e.g., signal 147). The IDDQ enable signal may be provided as the control signal, in an embodiment, or the IDDQ enable signal may be evaluated (e.g., by state confirmation element 148) along with another externally provided signal (e.g., external confirmation signal 149 received through pin 121) to produce the control signal, in another embodiment. In still another embodiment, the control signal may be provided directly by the test equipment (e.g., signal 149 received through pin 121 may serve as the control signal). Either way, with the switching circuit established in the non-conductive state, IDDQ (e.g., IDDQ 143) from the logic circuit may flow through a resistive element (e.g., resistive element 160) electrically connected in parallel with the switching element. The IDDQ thus results in an IDDQ indicating voltage presenting itself across the resistive element.

In block 218, the IDDQ indicating voltage is compared with the reference voltage (e.g., by comparison circuit 162). A determination is then made, in block 220, whether the IDDQ indicating voltage is greater than the reference voltage. Alternatively, a determination may be made whether the reference voltage is less than the IDDQ indicating voltage. Either way, when the IDDQ indicating voltage is not greater than the reference voltage, the DUT may output an indication (e.g., on pin 123), in block 222, that the IDDQ has a relatively low value. When the IDDQ indicating voltage is greater than the reference voltage, the DUT may output an indication (e.g., on pin 123), in block 224, that the IDDQ has a relatively high value. The test equipment may receive and store the indication of a relatively high or relatively low IDDQ for the particular test pattern currently scanned into the logic circuit, and may then proceed with the test. In block 226, a determination may be made whether all desired logic states have been tested. If not, the method iterates as shown by setting the logic circuit to a next test state. When all desired logic states have been tested, the method may end.

Figure 3:
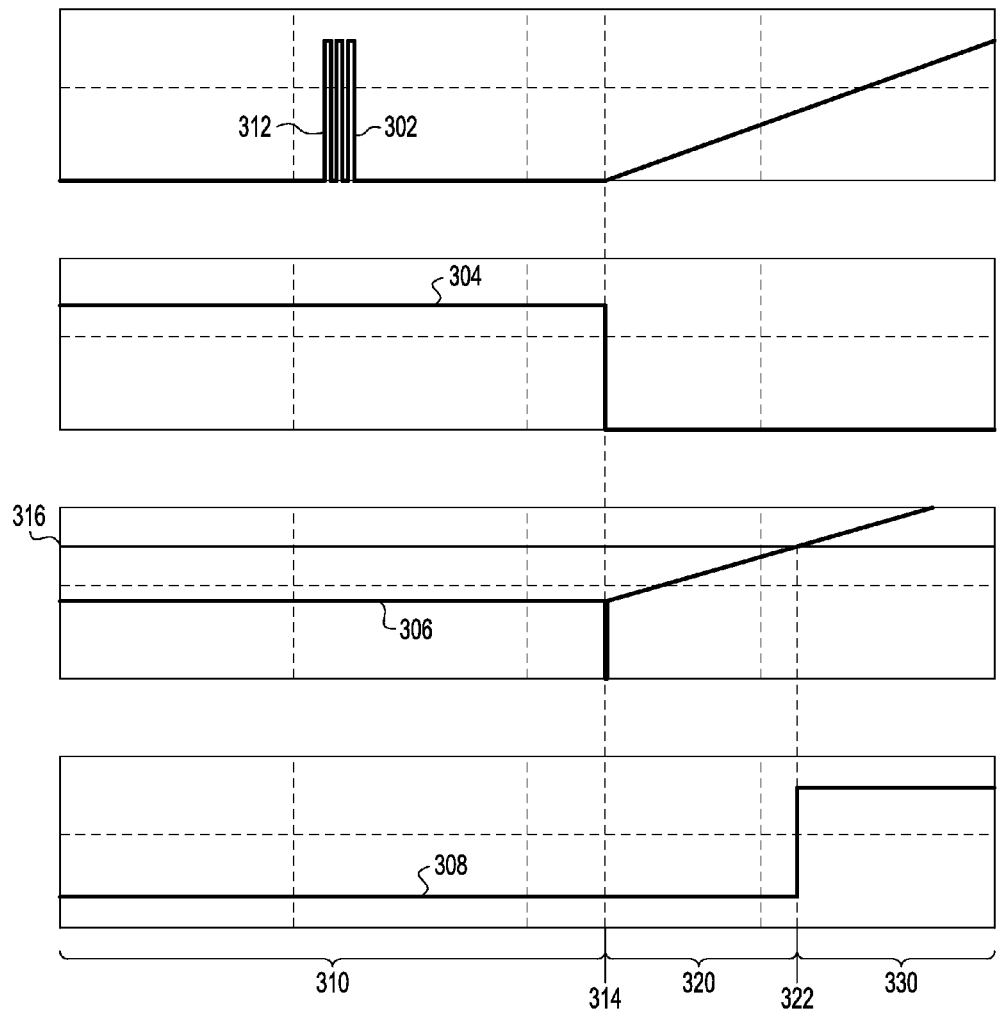
FIG. 3 illustrates various signals associated with performing an IDDQ test, according to an example embodiment.

FIG. 3 illustrates various signals associated with performing an IDDQ test, according to an example embodiment. Logic ground current signal 302 represents currents present at the ground side of a logic circuit (e.g., at logic ground output 152 of logic circuit 150), switching element control signal 304 represents a voltage signal presented as a control signal (e.g., signal 159) to a switching element (e.g., switching element 132) at the ground side of the logic circuit (or an inverse of an IDDQ test enable signal), IDDQ indicating voltage signal 306 represents voltages presented to an IDDQ evaluation circuit (e.g., circuit 134), and IDDQ threshold signal 308 represents an IDDQ indication (e.g., output signal 163) presented at a pin of a DUT (e.g., pin 123 of electronic circuit 110). For each signal representation, the horizontal axis represents time, and the vertical axis represents signal magnitude (e.g., current or voltage levels, as appropriate).

During a first time period 310, an electronic device (e.g., electronic device 110) is in a normal operational state. While in the normal operational state, logic current pulses 312 may be present in logic ground current signal 302. With the switching element control signal 304 in an asserted state (or the IDDQ test enable signal in a non-asserted state), the switching element (e.g., switching element 132) on the ground side of the logic circuit is in an electrically conductive state, and the current associated with the logic current pulses 312 and presented on the ground side of the logic circuit (e.g., at first ground node 154) may readily flow through the switching element to ground (e.g., to second ground node 156). A portion of the current also may flow through a first resistive element (e.g., first resistive element 160) electrically connected in parallel with the switching element, and accordingly, IDDQ indicating voltage signal 306 may indicate a relatively low voltage across the resistive element.

At time 314, the electronic device may determine that the device is to transition into the IDDQ evaluation state, and accordingly the switching element control signal 304 may be transitioned to a non-asserted state, which corresponds to the IDDQ test enable signal transitioning to an asserted state. At that time 314, the switching element on the ground side of the logic circuit transitions to an electrically non-conductive state, and substantially all IDDQ (e.g., IDDQ 153) presenting itself at the ground side of the switching element will flow through the first resistive element (e.g., resistive element 160). After time 314, a non-negligible IDDQ is indicated as an increasing current in logic ground current signal 302, and the resulting, increased voltage across the first resistive element is indicated in IDDQ indicating voltage signal 306. Although the increases in the logic current signal 302 and the IDDQ indicating voltage signal 306 are shown to be linear, this depiction is for example purposes only. In other situations, the logic current signal 302 and the IDDQ indicating voltage signal 306 may increase non-linearly, in a stepped manner or some other way.

Threshold voltage 316 corresponds to a reference voltage (e.g., a reference voltage presenting itself across second resistive element 166). During second time period 320, the IDDQ indicating voltage signal 306 is less than the threshold voltage 316. Accordingly, the IDDQ threshold signal 308 remains in a non-asserted state (e.g., a relatively low level). At time 322, however, the IDDQ indicating voltage signal 306 exceeds the threshold voltage 316. When this occurs, the IDDQ threshold signal 308 transitions to an asserted state (e.g., a relatively high level), and the IDDQ threshold signal 308 remains in the asserted state as long as the IDDQ indicating voltage signal 306 continues to exceed the threshold voltage 316 (e.g., during third time period 330). As discussed previously, the IDDQ threshold signal 308 may be observed externally to the electronic device (e.g., by test equipment 100). Accordingly, assertion of the IDDQ threshold signal 308 may be grounds for rejecting the electronic device.

Figure 4:
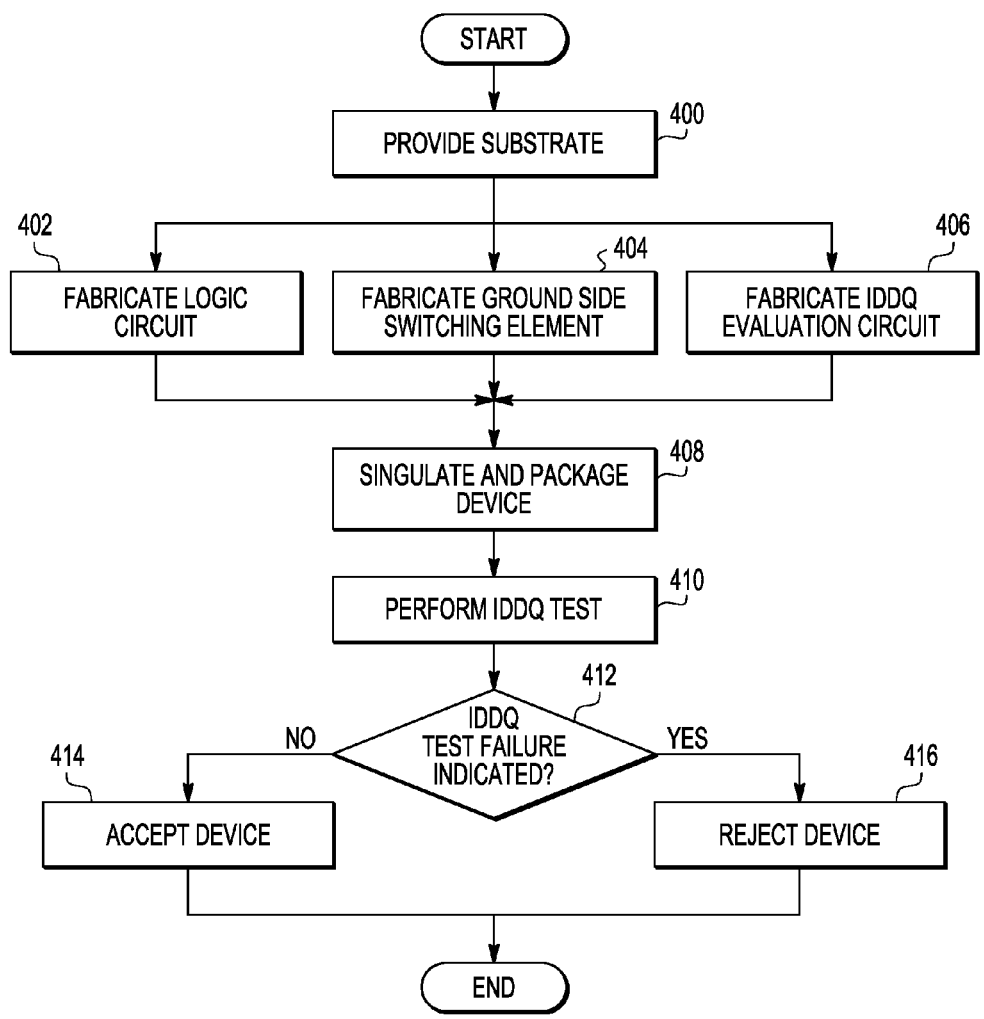
FIG. 4 is a flowchart of a method for fabricating and testing an electronic device that includes an IDDQ evaluation circuit, according to an example embodiment.

FIG. 4 is a flowchart of a method for fabricating and testing an electronic device that includes an IDDQ evaluation circuit, according to an example embodiment. The method may begin, in block 400, by providing a semiconductor substrate (e.g., a wafer). The semiconductor substrate may include, for example, a silicon substrate, a silicon germanium substrate, or any of a variety of other types of substrates.

One or more electronic devices (e.g., electronic device 110) may thereafter be formed on the semiconductor substrate. Although the description below refers to fabrication of only a single electronic device, it is to be understood that multiple instantiations of the electronic device simultaneously may be fabricated on the semiconductor substrate. Blocks 402, 404, and 406 correspond to fabrication of various portions of an electronic device, and may be performed in parallel or in any sequence. In block 402, a logic circuit (e.g., logic circuit 130) is fabricated on the substrate, where a ground side of the logic circuit is electrically coupled with a first ground node (e.g., ground node 154). As indicated previously, the logic circuit may include one or more internal flaws (e.g., non-robustly formed transistors) that may result in an unacceptably high IDDQ presenting itself at the ground side of the logic circuit.

In block 404, a switching element (e.g., switching element 132) is fabricated on the substrate between the first ground node and a second ground node (e.g., ground node 156), where the switching element also includes a control node (e.g., control node 158). As discussed previously, an asserted signal at the control node places the switching node in an electrically conductive state, thus permitting current freely to flow between the first and second ground nodes. Conversely, a non-asserted signal at the control node places the switching node in an electrically non-conductive state, thus restricting the free flow of current between the first and second ground nodes.

In block 406, an IDDQ evaluation circuit (e.g., IDDQ evaluation circuit 134) is fabricated on the substrate in electrical communication with the first and second ground nodes. According to an embodiment, fabricating the IDDQ evaluation circuit includes fabricating a first resistive element (e.g., resistive element 160) and a comparison circuit (e.g., comparison circuit 162), both electrically coupled with the first and second ground nodes. According to another embodiment, a current source (e.g., current source 140) and a temperature detection circuit (e.g., temperature detection circuit 180) also may be fabricated on the substrate. Both the IDDQ evaluation circuit (or more specifically the comparison circuit) and the current source may be electrically coupled with a reference node (e.g., reference node 170), thus enabling the IDDQ evaluation circuit to detect a reference voltage presented as a result of current produced by the current source. As described previously, the IDDQ evaluation circuit may be fabricated to include a resistive element electrically coupled between the first and second ground nodes, where an IDDQ indicating voltage may present itself across the resistive element when the electronic device is in an IDDQ evaluation state. In addition to the above described circuitry, additional circuitry (e.g., IDDQ test enable circuit 142, voltage source 136, additional circuitry 190, and other circuitry not illustrated in FIG. 1) also may be fabricated on the substrate.

In block 408, the electronic device may be singulated and packaged. Singulation may include separating the electronic device from other electronic devices that are fabricated on the same substrate. Packaging may include electrically connecting the logic circuit and the IDDQ evaluation circuit with pins (e.g., pins 120, 123) of the electronic device, and encapsulating the electronic device so that the pins are externally accessible.

In block 410, an IDDQ test may be performed for the electronic device. As discussed previously, this may include installing the packaged electronic device in a device carrier, where the device carrier is electrically interconnected with external test equipment (e.g., test equipment 100). The test equipment may thereafter provide various signals to the device pins to scan a test pattern into the logic circuit, transition the electronic device into the IDDQ evaluation state, transition the switching element into an electrically non-conducting state, and monitor a device pin at which an IDDQ indication may present itself, according to an embodiment.

In block 412, a determination may be made whether an IDDQ test failure is indicated. As discussed previously, when the IDDQ indication presenting itself at the device pin indicates that an IDDQ indicating voltage has not exceeded a reference voltage, it may be determined that the device has passed the IDDQ test. In such a situation, the device may be accepted, in block 414, and the method may end. Conversely, when the IDDQ indication presenting itself at the device pin indicates that an IDDQ indicating voltage has exceeded a reference voltage, it may be determined that the device has failed the IDDQ test. When this occurs, the device may be rejected, in block 416, and the method may end. Thus, various embodiments of methods and apparatus for performing IDDQ measurements have been described above. An embodiment includes an electronic device that includes a first ground node, a second ground node, a logic circuit, a switching element, and an IDDQ evaluation circuit. The logic circuit includes a logic ground output, and the logic ground output is electrically coupled to the first ground node. The switching element is electrically coupled between the first ground node and the second ground node, and the switching element is configurable in an electrically non-conductive state when the electronic device is in an IDDQ evaluation state. The switching element is configurable in an electrically conductive state when the electronic device is not in the IDDQ evaluation state. The IDDQ evaluation circuit is electrically coupled between the first ground node and the second ground node. When the electronic device is in the IDDQ evaluation state, the IDDQ evaluation circuit is configured to provide a first output signal when an IDDQ indicating voltage across the first and second ground nodes exceeds a reference voltage.

Another embodiment includes a method for producing an indication of IDDQ in an electronic device. The method includes setting a logic circuit of the electronic device to a test state, where a logic ground output of the logic circuit is electrically coupled to a first ground node of the electronic device. The method also includes controlling a switching element of the electronic device into an electrically non-conductive state, where the switching element is electrically coupled between the first ground node and a second ground node of the electronic device. The method also includes comparing, by a comparison circuit integrated within the electronic device, a reference voltage with an IDDQ indicating voltage across the first and second ground nodes. When the IDDQ indicating voltage exceeds the reference voltage, an output signal is produced at a first external contact of the electronic device. The output signal indicates that the IDDQ is relatively high.

Another embodiment includes a method for fabricating an electronic device. The method includes providing a substrate, and fabricating a logic circuit on the substrate, where the logic circuit includes a logic ground output, and the logic ground output is electrically coupled to a first ground node. The method also includes fabricating a switching element on the substrate and electrically coupled between the first ground node and a second ground node. The switching element is configurable in an electrically non-conductive state when the electronic device is in an IDDQ evaluation state, and the switching element is configurable in an electrically conductive state when the electronic device is not in the IDDQ evaluation state. The method also includes fabricating an IDDQ evaluation circuit on the substrate and electrically coupled between the first ground node and the second ground node. When the electronic device is in the IDDQ evaluation state, the IDDQ evaluation circuit is configured to provide a first output signal when an IDDQ indicating voltage across the first and second ground nodes exceeds a reference voltage.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. The term "electrically coupled," as used herein, is defined as directly or indirectly (e.g., through one or more intervening electrical components) connected in an electrical manner.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An electronic device comprising:
a first ground node;
a second ground node;
a logic circuit having a logic ground output, wherein the logic ground output is electrically coupled to the first ground node, and the logic circuit produces a quiescent current (IDDQ) that flows between the first ground node and the second ground node when the electronic device is in an IDDQ evaluation state;
a switching element electrically coupled between the first ground node and the second ground node, wherein the switching element is configurable in an electrically non-conductive state when the electronic device is in the IDDQ evaluation state, and the switching element is configurable in an electrically conductive state when the electronic device is not in the IDDQ evaluation state; and
an IDDQ evaluation circuit electrically coupled across the first ground node and the second ground node, wherein, when the electronic device is in the IDDQ evaluation state, the IDDQ evaluation circuit is configured to provide a first output signal when an IDDQ indicating voltage across the first and second ground nodes exceeds a reference voltage, wherein the IDDQ indicating voltage is related to the IDDQ that flows between the first ground node and the second ground node.

2. The electronic device of claim 1, wherein an output of the IDDQ evaluation circuit is electrically coupled with an external contact of the electronic device, and the first output signal is provided through the output of the IDDQ evaluation circuit to the external contact.

3. The electronic device of claim 1, wherein the IDDQ evaluation circuit also is electrically coupled to a reference node, and the reference voltage presents itself across the reference node and the second ground node, wherein the IDDQ evaluation circuit comprises:
a reference resistive element electrically coupled between the reference node and the second ground node; and
wherein the electronic device further comprises:
a current source electrically coupled to the reference node and configured to provide a current through the reference resistive element in order to produce the reference voltage.

4. The electronic device of claim 3, wherein the current source includes a current mirror circuit.

5. The electronic device of claim 1, wherein the switching element is responsive to a control signal to place the switching element in the electrically conductive state or the electrically non-conductive state, and wherein the switching element includes a metal oxide semiconductor field effect transistor (MOSFET) having a source, a drain, and a gate, wherein the source and the drain are coupled between the first ground node and the second ground node, and wherein the gate is responsive to the control signal to place the MOSFET in the electrically conductive state or the electrically non-conductive state.

6. An electronic device comprising:
a first ground node;
a second ground node;
a logic circuit having a logic ground output, wherein the logic ground output is electrically coupled to the first ground node;
a switching element electrically coupled between the first ground node and the second ground node, wherein the switching element is configurable in an electrically non-conductive state when the electronic device is in a quiescent current (IDDQ) evaluation state, and the switching element is configurable in an electrically conductive state when the electronic device is not in the IDDQ evaluation state; and
an IDDQ evaluation circuit electrically coupled between the first ground node and the second ground node, wherein, when the electronic device is in the IDDQ evaluation state, the IDDQ evaluation circuit is configured to provide a first output signal when an IDDQ indicating voltage across the first and second ground nodes exceeds a reference voltage, wherein the IDDQ evaluation circuit comprises:
a resistive element electrically coupled between the first ground node and the second ground node; and
a comparison circuit having a first input electrically coupled to the first ground node, a second input electrically coupled to the second ground node, a third input coupled to a reference node, and an output, wherein the IDDQ indicating voltage presents itself across the first and second inputs, and the reference voltage presents itself across the third and second inputs, and wherein the comparison circuit is configured to compare the reference voltage with the IDDQ indicating voltage, and to provide the first output signal at the output when the IDDQ indicating voltage exceeds the reference voltage.

7. An electronic device comprising:
a first ground node;
a second ground node;
a logic circuit having a logic ground output, wherein the logic ground output is electrically coupled to the first ground node;
a switching element electrically coupled between the first ground node and the second ground node, wherein the switching element is configurable in an electrically non-conductive state when the electronic device is in a quiescent current (IDDQ) evaluation state, and the switching element is configurable in an electrically conductive state when the electronic device is not in the IDDQ evaluation state;
an IDDQ evaluation circuit electrically coupled between the first ground node and the second ground node, wherein, when the electronic device is in the IDDQ evaluation state, the IDDQ evaluation circuit is configured to provide a first output signal when an IDDQ indicating voltage across the first and second ground nodes exceeds a reference voltage;
a reference voltage generation circuit configured to produce the reference voltage; and
a temperature detection circuit electrically coupled to the reference voltage generation circuit, and configured to provide a second output signal that indicates whether a device temperature does or does not exceed a pre-determined temperature threshold, and wherein
the reference voltage generation circuit is further configured to produce the reference voltage at a first level when the second output signal indicates that the device temperature does not exceed the pre-determined temperature threshold, and to produce the reference voltage at a second level that is higher than the first level when the second output signal indicates that the device temperature does exceed the pre-determined temperature threshold.

8. An electronic device comprising:
a first ground node;
a second ground node;
a logic circuit having a logic ground output, wherein the logic ground output is electrically coupled to the first ground node;
a switching element electrically coupled between the first ground node and the second ground node, wherein the switching element is configurable in an electrically non-conductive state when the electronic device is in a quiescent current (IDDQ) evaluation state, and the switching element is configurable in an electrically conductive state when the electronic device is not in the IDDQ evaluation state, wherein the switching element is responsive to a control signal to place the switching element in the electrically conductive state or the electrically non-conductive state;
an IDDQ evaluation circuit electrically coupled between the first ground node and the second ground node, wherein, when the electronic device is in the IDDQ evaluation state, the IDDQ evaluation circuit is configured to provide a first output signal when an IDDQ indicating voltage across the first and second ground nodes exceeds a reference voltage; and
an IDDQ test enable circuit electrically coupled to the switching element, wherein the IDDQ test enable circuit is configured to make a determination of whether or not the electronic device should enter the IDDQ evaluation state, and to produce the control signal in a manner that causes the switching element to be placed in the electrically non-conductive state when the determination is made that the electronic device should enter the IDDQ evaluation state.

9. The electronic device of claim 8, wherein the IDDQ test enable circuit comprises:
state determination circuitry configured to receive an external signal through a first external contact of the electronic device, to evaluate the external signal in order to make the determination, and to produce an IDDQ test enable signal indicating whether or not the determination is made.

10. The electronic device of claim 9, wherein the IDDQ test enable circuit further comprises:
a logical element having a first input, a second input, and an output, wherein the first input is electrically coupled to the state determination circuitry to receive the IDDQ test enable signal, the second input is electrically coupled to a second external contact of the electronic device, and the control signal is produced at the output as a result of a logical operation performed by the logical element.

11. The electronic device of claim 10, wherein the logical element includes a gate that implements a logical NAND operation.

12. The electronic device of claim 9, wherein the IDDQ test enable signal corresponds to the control signal.

13. A method for producing an indication of quiescent current (IDDQ) in an electronic device, the method comprising the steps of:
setting a logic circuit of the electronic device to a test state, wherein a logic ground output of the logic circuit is electrically coupled to a first ground node of the electronic device, the logic circuit produces the IDDQ, and the IDDQ can flow between the first ground node and a second ground node;
controlling a switching element of the electronic device into an electrically non-conductive state, wherein the switching element is electrically coupled across the first ground node and the second ground node of the electronic device;
comparing, by a comparison circuit integrated within the electronic device, a reference voltage with an IDDQ indicating voltage across the first and second ground nodes while the switching element is in the electrically non-conductive state, wherein the IDDQ indicating voltage is related to the IDDQ that flows between the first ground node and the second ground node; and
when the IDDQ indicating voltage exceeds the reference voltage, producing an output signal at a first external contact of the electronic device, wherein the output signal indicates that the IDDQ is relatively high.

14. The method of claim 13, wherein producing the output signal comprises producing a binary signal for which a first logic level indicates that the IDDQ indicating voltage exceeds the reference voltage and a second logic level indicates that the IDDQ indicating voltage does not exceed the reference voltage.

15. The method of claim 13, wherein controlling the switching element comprises:
making a determination, based on an external signal received through a second external contact of the electronic device, whether the electronic device should be set in an IDDQ evaluation state;
when the determination is made that the electronic device should be set in the IDDQ evaluation state, providing a control signal to the switching element that causes the switching element to be established in the electrically non-conductive state.

16. The method of claim 13, wherein the electronic device includes a first resistive element electrically coupled between the first and second ground nodes and a second resistive element electrically coupled between a reference node and the second ground node, and wherein comparing the reference voltage with the IDDQ indicating voltage comprises comparing the IDDQ indicating voltage produced across the first resistive element with the reference voltage produced across the second resistive element.

17. A method for producing an indication of quiescent current (IDDQ) in an electronic device, the method comprising the steps of:
setting a logic circuit of the electronic device to a test state, wherein a logic ground output of the logic circuit is electrically coupled to a first ground node of the electronic device;
determining whether a device temperature exceeds a threshold;
when the device temperature exceeds the threshold, establishing a reference voltage at a relatively high voltage level;
when the device temperature does not exceed the threshold, establishing the reference voltage at a relatively low voltage level;
controlling a switching element of the electronic device into an electrically non-conductive state, wherein the switching element is electrically coupled between the first ground node and a second ground node of the electronic device;
comparing, by a comparison circuit integrated within the electronic device, the reference voltage with an IDDQ indicating voltage across the first and second ground nodes while the switching element is in the electrically non-conductive state; and when the IDDQ indicating voltage exceeds the reference voltage, producing an output signal at a first external contact of the electronic device, wherein the output signal indicates that the IDDQ is relatively high.

\* \* \* \* \*